(12) United States Patent
Dinkel et al.

(10) Patent No.: US 11,776,882 B2
(45) Date of Patent: Oct. 3, 2023

(54) METHOD OF FABRICATING A SEMICONDUCTOR PACKAGE

(71) Applicant: Infineon Technologies Austria AG, Villach (AT)

(72) Inventors: Markus Dinkel, Unterhaching (DE); Petteri Palm, Regensburg (DE); Eung San Cho, Torrance, CA (US); Josef Hoeglauer, Heimstetten (DE); Ralf Otremba, Kaufbeuren (DE); Fabian Schnoy, Regenstauf (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/712,375

(22) Filed: Apr. 4, 2022

(65) Prior Publication Data

US 2022/0230941 A1 Jul. 21, 2022

Related U.S. Application Data

(62) Division of application No. 16/668,038, filed on Oct. 30, 2019, now Pat. No. 11,302,610.

(30) Foreign Application Priority Data

Oct. 31, 2018 (EP) .................................. 18203811

(51) Int. Cl.
*H01L 23/00* (2006.01)
*H01L 23/492* (2006.01)
(Continued)

(52) U.S. Cl.
CPC ........ *H01L 23/492* (2013.01); *H01L 23/5383* (2013.01); *H01L 23/5384* (2013.01);
(Continued)

(58) Field of Classification Search
CPC .............. H01L 23/492; H01L 23/5383; H01L 23/5384; H01L 2224/0233; H01L 2224/02335; H01L 2224/0237
See application file for complete search history.

(56) References Cited

U.S. PATENT DOCUMENTS 4,646,129 A 2/1987 Kerman et al.
7,271,470 B1 * 9/2007 Otremba ................. H01L 24/41
257/676
(Continued)

FOREIGN PATENT DOCUMENTS

CN 109727969 A 5/2019
DE 102013104337 A1 11/2013
(Continued)

OTHER PUBLICATIONS

Pinhopf, Wolfgang, "Cooling concepts for CanPAK(TM)* package", Infineon Technologies AG, Edition Feb. 28, 2011, Actual Release: Rev.1.0, accessed online at https://www.infineon.com/dgdl/Infineon-CanPAK_cooling_concepts-AN-v01_00-EN.pdf?fileId=db3a30432e5d3808012e703377015fe9 on Jan. 28, 2020.

*Primary Examiner* — Reema Patel
(74) *Attorney, Agent, or Firm* — Murphy, Bilak & Homiller, PLLC

(57) ABSTRACT

A method includes: arranging a semiconductor device on a redistribution substrate, the device having a first power electrode and a control electrode on a first surface and a second power electrode on a second surface, the redistribution substrate having an insulating board having a first major surface and a second major surface having solderable contact pads, so that the first power electrode is arranged on a first conductive pad and the control electrode is arranged on a second conductive pad on the first major surface; arranging a contact clip such that a web portion is arranged on the second power electrode and a peripheral rim portion is
(Continued)

arranged on a third conductive pad on the first major surface; and electrically coupling the first power electrode, control electrode and peripheral rim portion to the respective conductive pads and electrically coupling the web portion to the second power electrode.

22 Claims, 7 Drawing Sheets

(51) Int. Cl.
*H01L 23/538* (2006.01)
*H01L 25/16* (2023.01)

(52) U.S. Cl.
CPC .............. *H01L 24/08* (2013.01); *H01L 24/89* (2013.01); *H01L 25/16* (2013.01); *H01L 2224/08225* (2013.01); *H01L 2224/80801* (2013.01)

(56) References Cited

U.S. PATENT DOCUMENTS

| | | | |
|---|---|---|---|
| 7,315,081 B2 | 1/2008 | Standing | |
| 7,757,392 B2 * | 7/2010 | Otremba | ........... H01L 23/49575 |
| | | | 257/692 |
| 10,170,428 B2 | 1/2019 | Pietambaram et al. | |
| 10,192,795 B2 | 1/2019 | Mori | |
| 10,617,012 B2 | 4/2020 | Zluc et al. | |
| 11,043,409 B2 | 6/2021 | Palm | |
| 11,069,667 B2 | 7/2021 | Gani | |
| 2001/0048156 A1 | 12/2001 | Fukuizumi | |
| 2006/0214186 A1 | 9/2006 | Hamidi et al. | |
| 2007/0266558 A1 | 11/2007 | Otremba | |
| 2010/0044842 A1 | 2/2010 | Mengel et al. | |
| 2012/0235293 A1 | 9/2012 | Jones et al. | |
| 2013/0292684 A1 | 11/2013 | Nikitin et al. | |
| 2014/0110788 A1 | 4/2014 | Cho et al. | |
| 2014/0217576 A1 | 8/2014 | Im et al. | |
| 2015/0001699 A1 | 1/2015 | Funatsu et al. | |
| 2015/0255380 A1 | 9/2015 | Chen | |
| 2017/0221798 A1 | 8/2017 | Cho | |
| 2017/0287886 A1 | 10/2017 | Gani | |
| 2018/0054120 A1 | 2/2018 | Cho | |
| 2018/0269146 A1 | 9/2018 | Palm | |
| 2019/0273017 A1 | 9/2019 | Palm | |
| 2020/0135619 A1 | 4/2020 | Dinkel et al. | |

FOREIGN PATENT DOCUMENTS

| | | |
|---|---|---|
| DE | 102017105330 A1 | 9/2018 |
| EP | 3376539 A1 | 9/2018 |

* cited by examiner

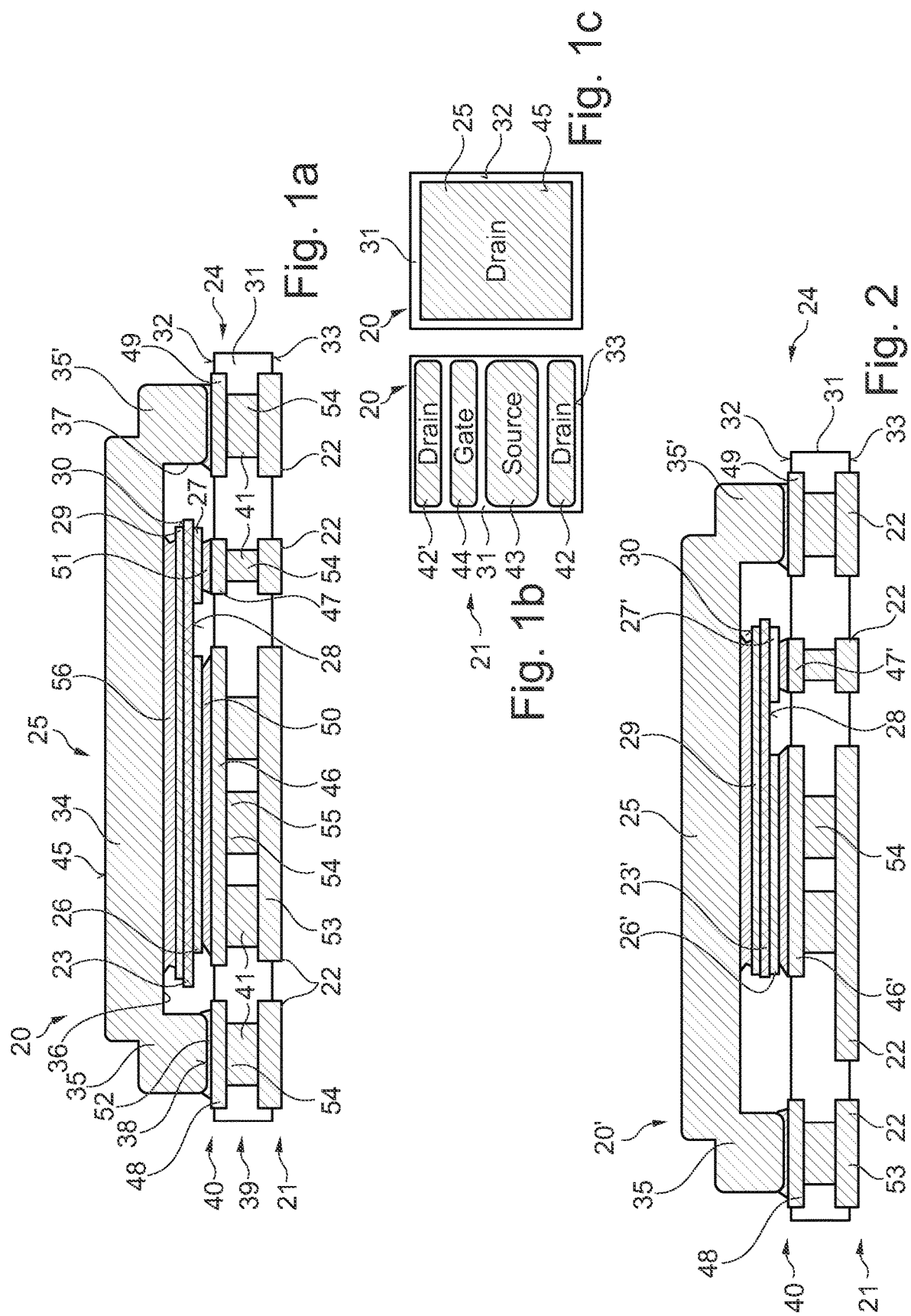

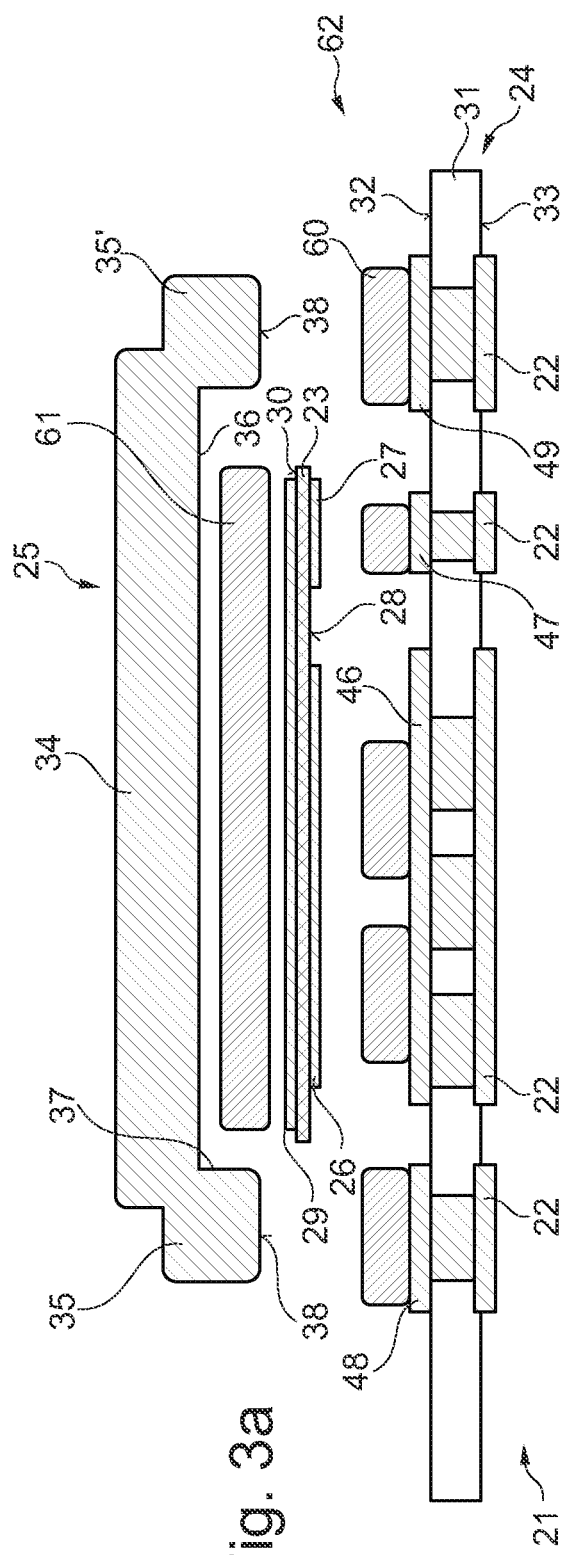
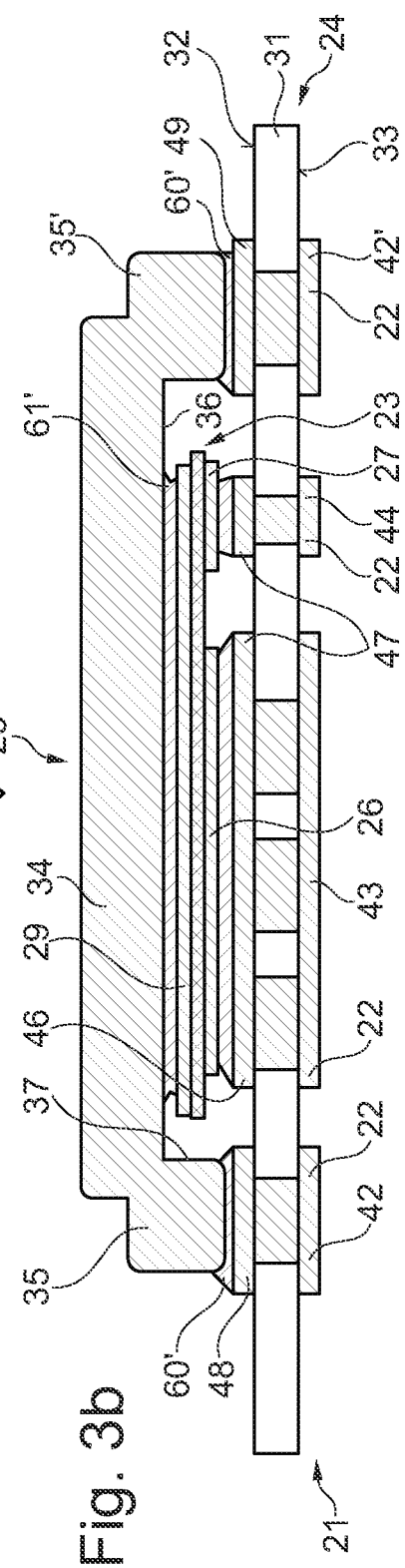

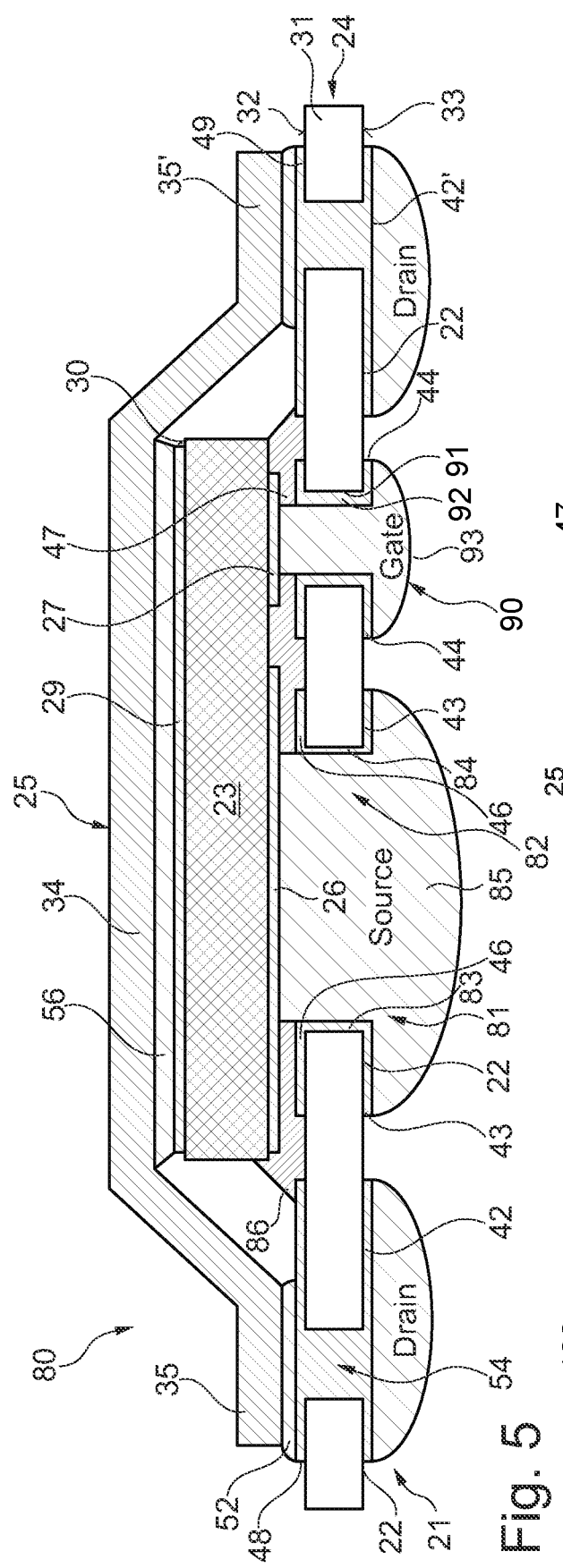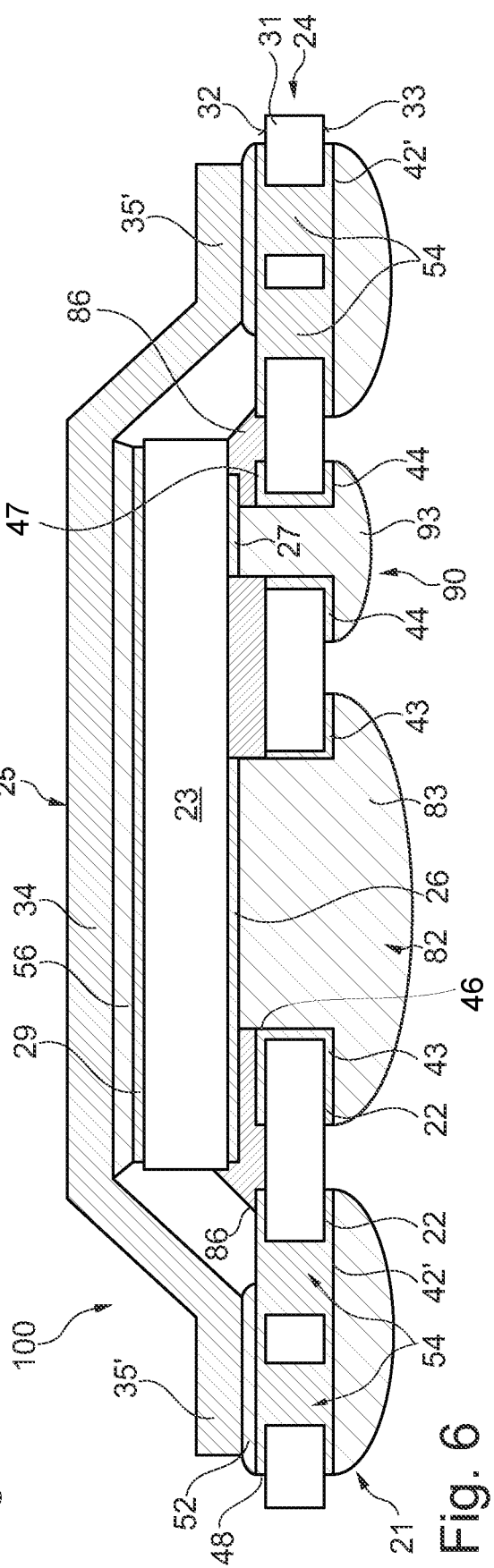

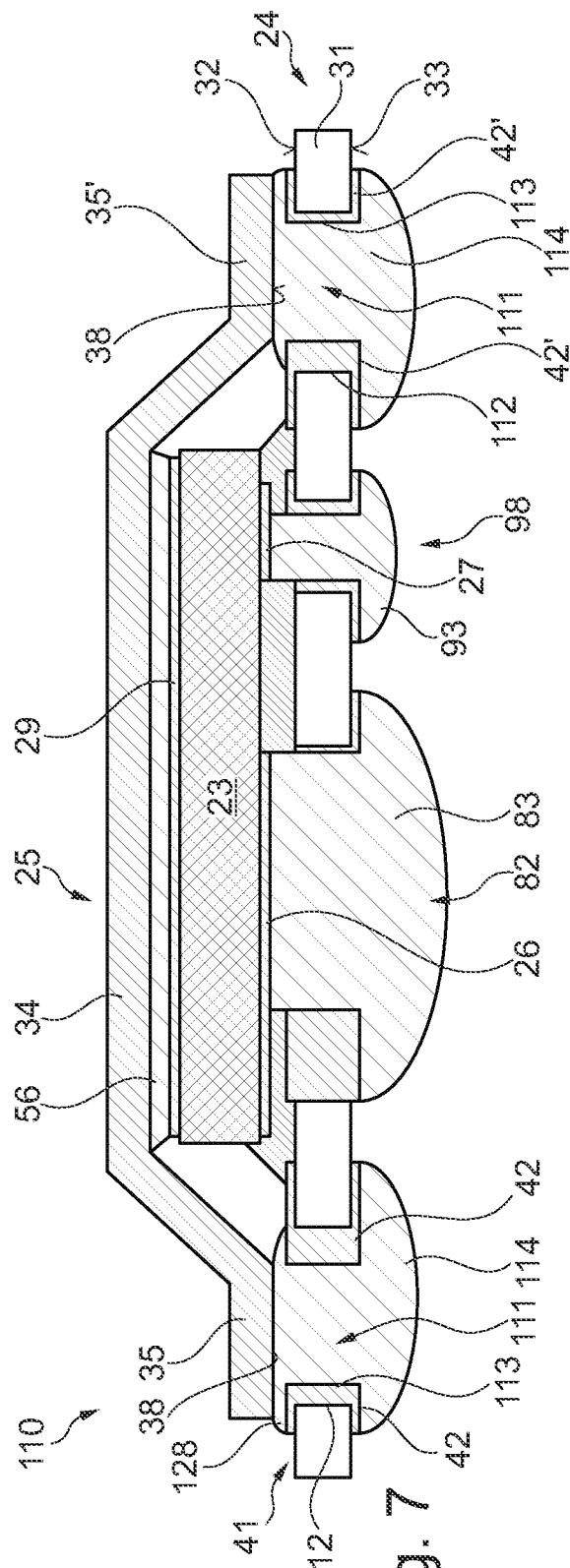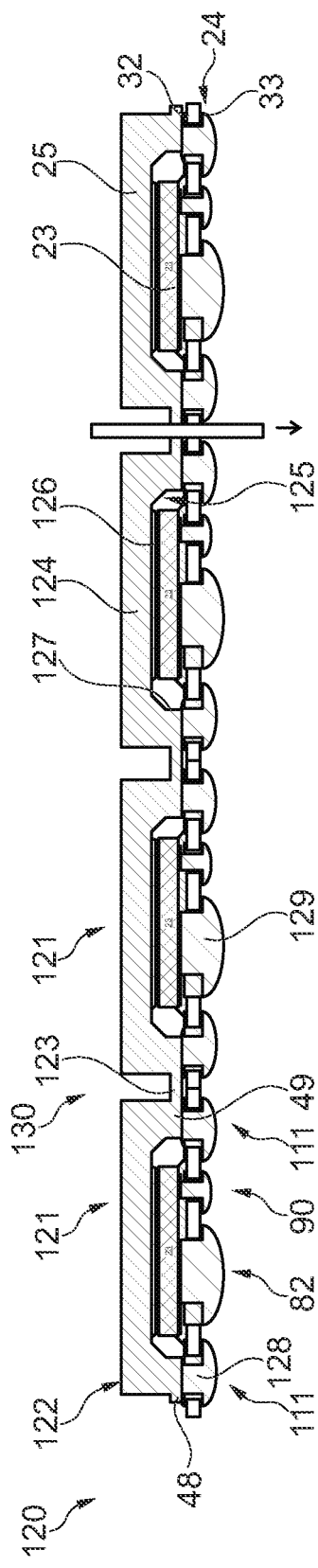

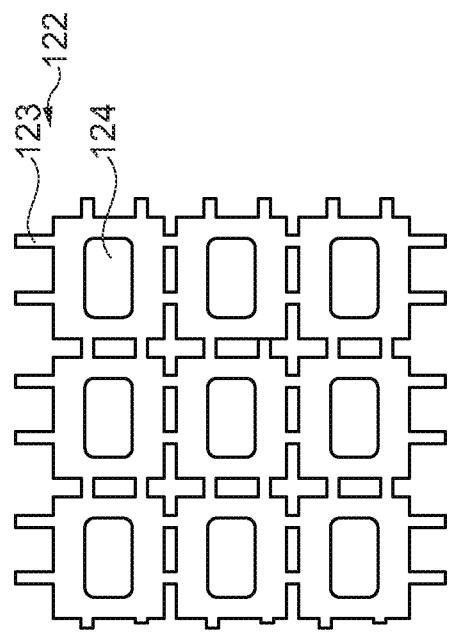
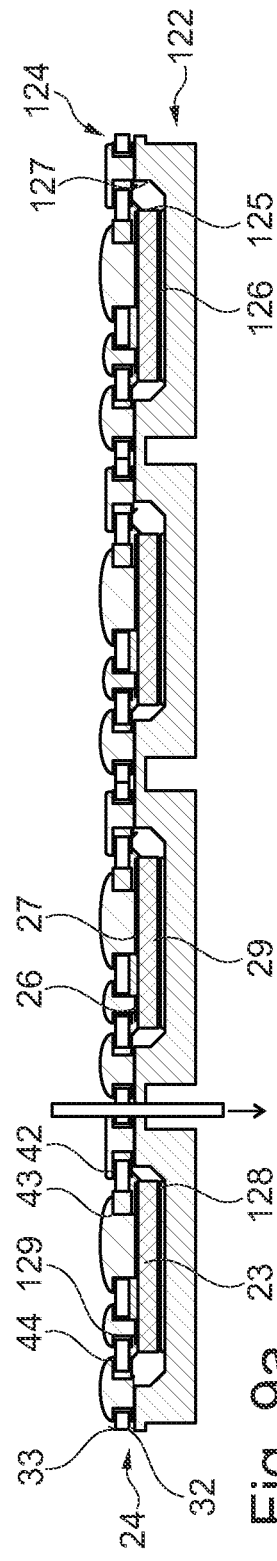
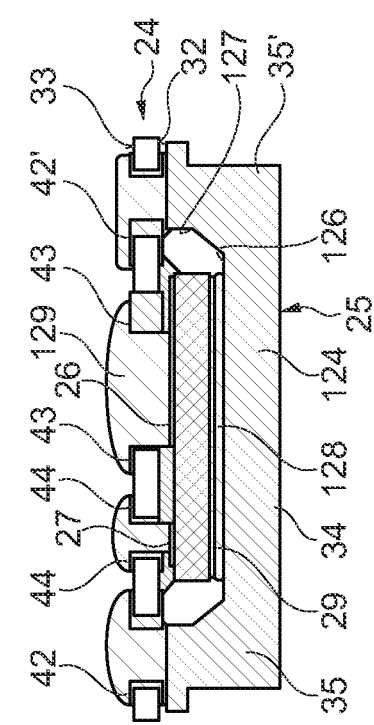
Fig. 8b
Fig. 9a
Fig. 9b

METHOD OF FABRICATING A SEMICONDUCTOR PACKAGE

BACKGROUND

A semiconductor device is commonly provided in a package. The package includes internal electrical connections from the semiconductor device to a substrate or a leadframe which includes outer contacts. The outer contacts may have the form of pins or solder balls, for example, and are used to mount the package on a substrate, for example a redistribution board, such as a printed circuit board. The package typically includes a housing which covers the semiconductor device and the internal electrical connections. The housing may include a plastic material, such as epoxy resin, and may be formed by a mold process, such as injection molding.

SUMMARY

In an embodiment, a semiconductor package comprises a package footprint comprising a plurality of solderable contact pads, a semiconductor device comprising a first power electrode and a control electrode on a first surface and a second power electrode on a second surface that opposes the first surface, a redistribution substrate comprising an insulating board having first major surface and a second major surface, wherein the first power electrode and the control electrode are mounted on the first ma or surface of the insulating board and the solderable contact pads of the package footprint are arranged on the second major surface of the insulating board and a contact clip comprising a web portion and one or more peripheral rim portions. The web portion is mounted on and electrically coupled to the second power electrode and the peripheral rim portion is mounted on the first major surface of the insulating board.

In an embodiment, a method of fabricating a semiconductor package comprises arranging a semiconductor device on a redistribution substrate, the semiconductor device having a first power electrode and a control electrode on a first surface and a second power electrode on a second surface that opposes the first surface, the redistribution substrate comprising an insulating board having a first major surface and a second major surface having solderable contact pads that form a package footprint, so that the first power electrode is arranged on a first conductive pad and the control electrode is arranged on a second conductive pad on the first major surface of the insulating board, arranging a contact clip comprising a web portion and one or more peripheral rim portions on the semiconductor device such that the web portion is arranged on the second power electrode and the peripheral rim portion is arranged on a third conductive pad on the first major surface of the insulating board, and electrically coupling the first power electrode, the control electrode and the peripheral rim portion to the conductive pads on the first major surface of the redistribution substrate and electrically coupling the web portion to the second power electrode.

Those skilled in the art will recognize additional features and advantages upon reading the following detailed description, and upon viewing the accompanying drawings.

DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 1a to 1c illustrates respective cross-sectional, bottom view and top views of a semiconductor package according to an embodiment.

FIG. 2 illustrates a cross-sectional view of a semiconductor package according to an embodiment.

FIGS. 3a and 3b illustrate a method for fabricating a semiconductor package.

FIG. 5 illustrates a cross-sectional view of a semiconductor package according to an embodiment.

FIG. 6 illustrates a cross-sectional view of a semiconductor package according to an embodiment.

FIG. 7 illustrates a cross-sectional view of the semiconductor package according to an embodiment.

FIG. 8a illustrates a panel for fabricating a plurality of semiconductor packages.

FIG. 8b illustrates a leadframe including a plurality of cans for fabricating a plurality of semiconductor packages.

FIGS. 9a and 9b illustrate a method for fabricating a semiconductor package.

DETAILED DESCRIPTION

Figure 4:
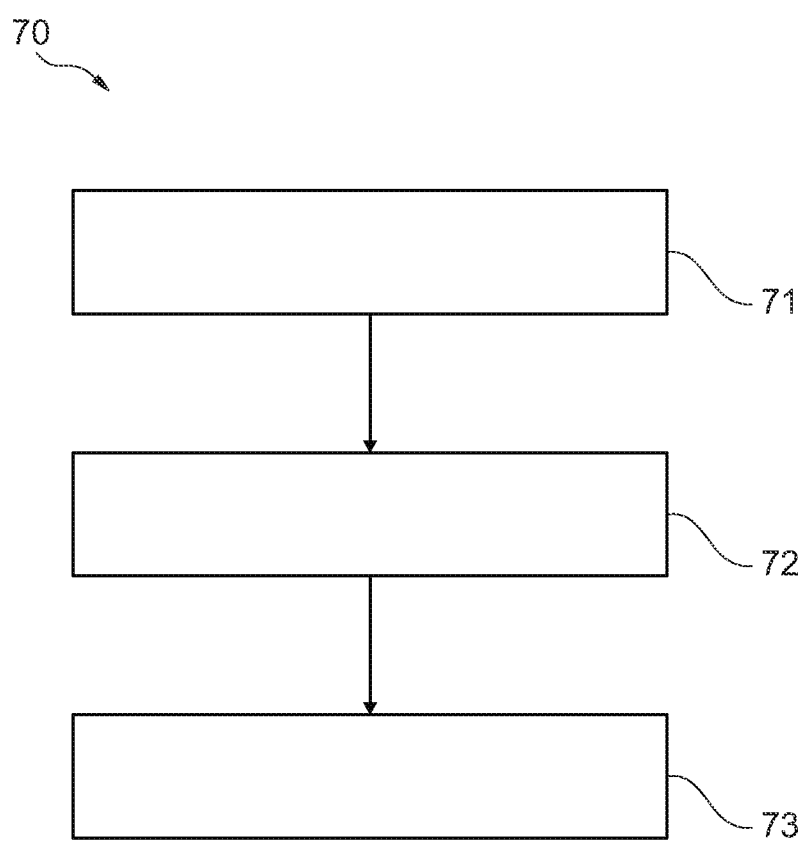
FIG. 4 illustrates a flowchart of a method for fabricating a semiconductor package.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood co mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1a to 1c illustrate respective views of a semiconductor package 20. FIG. 1a illustrates a cross-sectional view, FIG. 1b a bottom view and FIG. 1c a top view of the semiconductor package 20.

The semiconductor package 20 includes a package footprint 21 which comprises a plurality of solderable contact pads 22, a semiconductor device 23, a redistribution substrate 24 and a contact clip 25. The semiconductor device 23 includes a first power electrode 26 and a control electrode 27 on a first surface 28 and a second power electrode 29 on the second surface 30 that opposes the first surface 23.

The semiconductor device 23 may be a transistor device with a vertical drift path, such as a Metal Oxide Semiconductor Field. Effect. Transistor (MOSFFT), Insulated Gate Bipolar Transistor (IGBT) device or a bipolar junction transistor (BJT) device. The first power electrode 26 may be a source electrode, the control electrode 27 may be gate electrode and the second power electrode 29 may be a drain electrode.

The redistribution substrate 24 includes an insulating board 31 having a first major surface 32 and a second major surface 33 which opposes the first major surface 32. The solderable contact pads 22 of the package footprint 21 are arranged on the second major surface 33 of the insulating board 31. The first power electrode 26 and the control electrode 27 of the semiconductor device 23 are mounted on the first major surface 32 of the insulating board 31.

The contact clip 25 includes a web portion 34 and one or more peripheral rim portions 35. The web portion 34 is mounted on and electrically coupled to the second power electrode 29 and the peripheral rim portion 35 is mounted on the first major surface 32 of the insulating board 31 of the redistribution substrate 24. The web portion 34 has a lateral size such that the peripheral rim portion 35 is arranged adjacent and spaced apart by a distance from side faces of the semiconductor device 23.

The semiconductor package 20 includes an electrically conductive contact clip 25 which electrically couples the upwardly facing second power electrode 29 to the first major surface 32 of the redistribution substrate 24 which is arranged adjacent the opposing first surface 28 of the semiconductor device 23. The contact clip 25 may be formed of copper.

In some embodiments, such as that illustrated in FIGS. 1a-1c, the contact clip 25 includes two peripheral rim portions 35, 35' extending from opposing sides of the web portion 34 and can be considered to be a can having a recess. The recess is provided by the mounting surface 36 of the web portion 34 and inner sidewalls 37 of she peripheral rim portions 35, 35' in which the semiconductor device 23 is accommodated. The depth of the recess or height of the inner sidewalls 37 is greater than the thickness of the semiconductor device 23. The lower surface 38 of the peripheral rim portions 35, 35' is substantially parallel to the web portion and provides contact areas for the contact clip 25.

In some embodiments, a peripheral rim portion extends from all sides of the web portion 34. In these embodiments, the height of the inner sidewalls may differ. For example, for a square or rectangular recess, the height of the inner side walls 37 on two opposing sides of the web portion 34 may be greater to provide two contact surfaces 38 and the height of the other two side walls may be lower so that these side walls are not in contact with the first major surface 32 of the insulating board. 31 when the two contact surfaces 38 are in contact with the first major surface 32 of the insulating board 31.

The redistribution substrate 24 includes a conductive redistribution structure 39 which includes conductive pads 40 positioned on the first major surface 32 of the insulating board 31 and the solderable contact pads 22 arranged on the second major surface 33 which provide the package footprint 21. The redistribution structure 39 also includes one or more vertical conductive paths 41 in order to electrically connect, the conductive pads 40 and solderable contact pads 22 positioned on opposing major surfaces 32, 33 of the insulating board 31 to one another.

The plurality of conductive pads 10 may include a first conductive pad 46 for the first power electrode 26, a second conductive pad 47 for the control electrode 27 and a conductive pad 48, 49 for each of the peripheral rim portions 35, 35'. The lateral size and shape of the conductive pads 46, 47, 48, 49 may differ and be configured to align with the lateral size and shape of the first power electrode 26 and control electrode 27 and with the peripheral rim portions 35, 35'.

A lateral redistribution of the conductive paths can be provided by appropriate positioning of the conductive pads 40 and/or solderable contact pads 22 in combination with the vertical conductive paths 41. The use of the redistribution substrate 24 enables the package footprint 21 to have a different arrangement from the arrangement of the peripheral rim portions 35 and the first load electrode 26 and the control electrode 27.

In some embodiments, the solderable contact pads 22 of the footprint 20 include a pre-plating layer 53 which improves the solderability of the contact pads 22. The pre-plating layer 53 may include NiSn and may include two or more sublayers.

The semiconductor package 20 can be considered co combine a can-based package, such as a package commercially available under the trade names DirectFET® or Can-PAK®, with a redistribution substrate 24 providing a conductive redistribution structure 39 and the package footprint 21.

In a can-based package, the semiconductor device 23 is positioned within the recess provided by the mounting surface 36 of the web portion 34 and inner sidewalls 37 of the peripheral rim portions 35, 35'. In such can-based packages, the package footprint is provided by a combination of the lower surfaces 38 of the peripheral rim portions 35, 35' and the first load electrode 26 and control electrode 27 of the semiconductor device 23.

In contrast, in the semiconductor package 20, the footprint 21 is provided by the solderable contact pads 22 arranged on the redistribution substrate 24. The lower contact surfaces 38 of the peripheral rim portion. 35 of the contact clip 25, the first power electrode 26 and control electrode 27 provide internal connections of the semiconductor package 20. Therefore, the package footprint 21 can have an arrangement of the solderable contact pads 22 which is independent of the arrangement of the peripheral rim portions 35, 35" of the contact clip 24, and the first power electrode 26 and control electrode 27 positioned on the first surface 28 of the semiconductor device 23.

The switching capability of a vertical transistor device is largely determined by its area. Therefore, in order to provide packages including different switching capacities, it is useful to be able to include vertical transistor devices of differing lateral area in the package 20. By using the redistribution substrate 24 in combination with the can, any change in the position of the first power electrode 26 and/or control electrode 27 brought about by a change in the lateral size of the semiconductor device 23 does not lead to a change in the footprint of the package. The arrangement of the internal connections to the semiconductor device 23 provided by the contact pads 40 on the first major surface 32 is independent of the package footprint 21. Consequently, the semiconductor package 20 can be used with semiconductor devices 23 of different lateral sizes whilst maintaining the same footprint.

FIG. 2 illustrates an embodiment in which a semiconductor device 23' having a smaller lateral area than the semiconductor device 23 of FIGS. 1a-1c is mounted within the contact clip 25 and on the redistribution substrate 24 of the package 20. The package 20' has the same package footprint 21 that illustrated in FIGS. 1a and 1b.

As can be seen in FIG. 2, the lateral size of the first conductive pad. 46' may be smaller than the lateral size of the first conductive pad 46 in the semiconductor package 20 of FIGS. 1a-1c since the first power electrode 26' of the semiconductor device 23' has a smaller lateral area. The control electrode 27' and consequently the conducive pad 47' may be in a different position with respect to the peripheral rim portions 35, 35' and their respective conductive pads 48, 49. However, the position and your of the solder able contact pads 22 is the same as in the package 20 including the larger semiconductor device 23. The contact clip 25 may have the same lateral size as shape as in the semiconductor package illustrated in FIGS. 1a-1c.

As illustrated in FIG. 1b, the package footprint 21 may include four strip-like solderable contact pads 22 which are arranged substantially parallel to one another, whereby the outermost two pads provide drain pads 42, 42' and the source pad 43 and gate pad 44 are arranged between the drain pads 42, 42'. From the top view illustrated in FIG. 1C, it can be seen that the upper side of the package 20 includes the upper surface 45 of the web portion 34 of the contact clip 25.

The semiconductor package 20 enables better heat dissipation from both the upper surface, due to the exposed contact clip 25, and from the lower surface due to the conductive redistribution structure 39 of the redistribution substrate 21.

In some embodiments, the semiconductor package 20 is entirely free of moulding material such that the outermost surface of the package 20 is formed by the outermost surface of the contact clip 25, side faces and the second major surface 33 of the insulating board 31 and the solderable contact pads 22. The gaps between the semiconductor device 23 and inner surfaces 36, 37 of the contact clip 25 and the first major surface 32 of the insulating board 31 remain unoccupied by underfill, mold material or other insulating material.

The first power electrode 26 may be mounted to a first conductive pad. 46, the control electrode 27 to a second conductive pad. 47 and the peripheral rim portions 35, 35' to third and fourth conductive pads 48, 49 by solder connections 50, 51, 52, which may be formed by soft solder. The second power electrode 29 may be attached to the mounting surface 36 of the web portion 34 by a solder connection 56 which may be formed by applying solder paste to the mounting surface 36 of the second power electrode 29. The solder connections 50, 51, 52 and 56 are internal connections.

In some embodiments, the solder providing each of these internal conductive connections 50, 51, 52, 56 has a melting point which is greater than the melting point of the solder which is to be used to mount the semiconductor package 20 to a higher level circuit board, that is the solder which is to be applied to the solderable contact pads 22. In some embodiments, the solderable of the internal connections 50, 51, 52, 56 has a melting point which is greater than 230° C. or has a melting point of 260° C. or greater. In these embodiments, the melting point of the solder applied to the solderable contact, pads 22 may have a maximum value of 230° C.

In some embodiments, the difference between the melting point of the solder of the internal connections 50, 51, 52, 56 and the melting point of the solder to be used for the solderable contact pads 22 is sufficiently large to allow for variations in the temperature to which she package 20 is subjected during the soldering process so attach the solderable contact pads 22 to the higher level circuit board. For example, the solder for the outer contact pads 22 may have a melting point of 230° C. A temperature that is slightly higher than 230° C. may be used in the soldering process to ensure that the solder has completely melted. In these embodiments, solder with a higher melting point than the temperature used in the solder processing is used. For example, a solder having a melting point, of 260° C. or greater may be selected for the internal solder connections 50, 51, 52, 56 such that melting of these internal solder connections 50, 51, 52, 56 during formation of the outer solder connections is avoided and movement of the semiconductor device 23 and/or the contact clip 25 relative to the redistribution substrate 24 and/or one another is avoided.

One or more of the vertical conductive paths 41 may be provided by a conductive via 54 which extends from one of the conductive pads 40 to a solder able contact pad 22 arranged on the opposing side of the insulating board 31 in order to couple the conductive pad 40 with the solderable contact pad 22. The conductive via 54 may include a via or through-hole positioned in the insulating board 31 which is lined or filled with conductive material 55, for example one or more metals or alloys. One or more conductive vias 54 may be used for each vertical conduction path, for example for a vertical conductive path between the conductive pad 46 on which she first power electrode 26 is mounted and the solderable contact pad 43 and/or between the peripheral rim portion 35 and the solderable contact pad 42 and/or between the peripheral rim portion 35' and the solderable contact pad 42'. A single conductive via 54 may be used for the gate connection between the conductive pad 47 and the solderable contact pad 44.

The semiconductor device 23 may be a vertical transistor device such as a MOSFET device, Insulated Gate Bipolar Transistor (IGBT) device or s, bipolar junction transistor (BJT) device. The term. "first power electrode" encompasses not only a source of a MOSFET device but also an emitter of an insulator gate bipolar transistor (IGBT) device and an emitter of a BJT device, the term "second power electrode" encompasses not only a drain of a MOSFET device but also a collector of an insulator gate bipolar transistor (IGBT) device and a collector of a BJT device, and the term "control electrode" encompasses not only a gate of the MOSFET device but also a gate of an insulator gate bipolar transistor (IGBT) device and a base of a BJT device.

The first and second power electrode 26 and control electrode 27 and the second power electrode 29 of the semiconductor device 23 may be provided by solderable front side metallisation and solderable backside metallisation, respectively.

The redistribution substrate 24 may be provided as a preformed prefabricated part including the conductive pads 40, solderable contact pads 22 and vertical conductive paths 41 conforming to a pre-determined design. The insulating board 31 of the redistribution substrate 24 may include a substantially planar prefabricated board including a material such as glassfibre reinforced matrix, or other material, which is typically used to fabricate a core layer for a printed circuit board. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The redistribution structure 39 may be a two-layer substrate including conductive traces or pads 40, 22 on the two opposing major surfaces 32, 33 and conductive vias 54 which may be lined or filled with one or more metallic or alloy layers. The contact pads 40, 22 may include copper. The conductive vias 54 may also include copper as a lining or filler material. In some embodiments, a conductive vertical path can be provided by metal blocks, for example copper blocks, embedded in the insulation board. The vias or through-holes in the insulating board 31 may be made by punching or drilling. A panel including a large number of package positions, each package position including an insulation board with a redistribution structure for a single package can be provided.

The semiconductor package according to embodiments described herein can be used for semiconductor devices having a smaller thickness, for example, semiconductor devices fabricated from a silicon wafer having a thickness of less than 120 µm. In some embodiments, the semiconductor device has a thickness in the range of 20 µm to 60 µm or 20 µm to 40 µm as the semiconductor device is mounted on the redistribution board. The reduced thickness enables the RDSon*A to be improved. The package also has a low package resistance.

The temperature cycle on board (TCoB) robustness is improved due to the use of the redistribution board in combination with the contact clip or can, since the redistribution board has a coefficient of thermal expansion which is similar to the coefficient of thermal expansion of the higher level redistribution board on which the package is mounted.

The semiconductor package enables improved double-sided cooling as the contact clip or can is formed of a metal or alloy and provides a surface on which a heatsink can be provided. Heat generated by the semiconductor device 23 can also be dissipated by means of the conductive redistribution structure 39 of the redistribution substrate 24 from the opposing lower side of the semiconductor package 20.

In some embodiments, the package may include further semiconductor devices, such as one or more passive devices, such as a capacitor or an inductor. The further device or devices may be mounted on the redistribution substrate adjacent to the semiconductor device and contact clip. The passive device may be electrically coupled to the semiconductor device by means of a conductive trace or traces arranged on the first major surface of the redistribution board.

A method of fabricating a semiconductor package, such as the semiconductor package 20 illustrated in FIGS. 1*a*-1*c* and the semiconductor package 50 illustrated in FIG. 2, is described with reference to FIGS. 3*a* and 3*b*.

The redistribution substrate 24 is provided that includes the conductive pads 40 on the first major surface 32 of the insulating board 31 and solderable contact pads 22 forming the package footprint 21 arranged on the second major surface 33. In this embodiment, the redistribution substrate 24 includes conductive vias 54 providing the vertical conductive paths 41 between the first and second major surfaces 32, 33 of the insulating board 31.

A solder deposit 60 is applied to the conductive pads 48, 49 which are to be connected to the peripheral rim portions 35, 35' of the contact clip 25, the first conductive pad 46 which is to be electrically connected to the first power electrode 26 of the semiconductor device 23 and the second conductive pad 37 which is to be connected to the control electrode 27 on the first surface 28 of the semiconductor device 23. The semiconductor device 23 is placed onto the solder 60 arranged on the first pad 46 and on the second pad 47 such that the first power electrode 26 is arranged on the solder 60 and is positioned directly above the first pad 16 and such that the control electrode 27 is arranged on the solder 60 and directly above the second pad 47. A solder deposit 61 is applied to the second power electrode 29 and the conductive clip 25 is positioned on the solder deposit 61 arranged on the semiconductor device 23 and on the solder deposits 60 arranged on the third and fourth conductive pads 48, 49 to form an assembly 62. The solder deposits 60, 61 may include solder paste which includes solder particles having a melting point of above 230° C. or 260° C. or greater and a binder and/or solution.

A solder process is carried out, for example by a solder reflow process, in which the assembly 62 illustrated in FIG. 3*a* is heated to a temperature above the melting point of the solder 60. Such a solder reflow process may be carried out in an inert atmosphere and may be carried out in a continuous process by passing the assembly 62 through an oven.

The conductive pads 46, 47, 48, 49 are electrically coupled to respective solderable contact pads 22 on the opposing side of the insulation board 31 by conductive vias 41. Consequently, heating the assembly 62, melting the solder deposits 60, 61 and subsequently cooling the assembly to re-solidifying the solder and form solder connections 60', 61' electrically couples the first power electrode 26 to the first conductive pad 46 and the first solderable contact pad 43, electrically couples the control electrode 27 to the second conductive pad 47 and the second solderable contact pad 44 and the second power electrode 29 to the conductive pads 48, 49 and the solderable contact pads 42, 42 pads by way of the silver deposit 61 between the second power electrode 29 and the contact clip 25 and the solder deposit 60 between the peripheral rim portions 35, 35' and the conductive pads 48, 49.

The thickness of the solder deposits 60, 61 may be selected such that after melting of the solder paste, sufficient solder is provided to cover the entire surfaces, or a sufficient proportion of these surfaces, which are to be connected, for example, the lower surface 38 of the peripheral rim portions 35, 35' and the conductive pads 40, 49.

The amount of solder used for the solder deposits 60, 61 may be selected such that a height compensation mechanism is provided such that the web portion 34 of the contact clip 25 is connected via the solder connection 61' to the second power electrode 29 and the lower surfaces 38 of the peripheral rim portions 35, 35' are connected via a solder connection 60' to third and fourth conductive pads 48, 49 and such that the first power electrode 26 is connected by a solder connection 60' to the first pad 46 and the control electrode 27 is connected by solder connection 60' to the second pad 47. Therefore, any difference in height between the thickness of the semiconductor device 23 including the metallisation providing the electrodes 26, 27, 29 and the depth of the can provided by the mounting surface 36 and in the sidewalls 37 can be compensated, as illustrated in FIG. 3b, FIG. 4 illustrates a flowchart. 70 of a method of fabricating a semiconductor package.

In block 71, a semiconductor device is arranged on a redistribution substrate. The semiconductor device has a first power electrode and a control electrode on a first surface and a second power electrode on a second surface that opposes the first surface. The redistribution substrate comprises an insulating board having a first major surface and the second major surface having solderable contact pads that form a package footprint. The semiconductor device is arranged on the redistribution substrate so that the first power electrode is arranged on a first conductive pad and the control electrode is arranged on a second conductive pad on the first major surface of the insulating board.

In block 72, a contact clip comprising a web portion and one or more peripheral rim portions is arranged on the semiconductor device such that the web portion is arranged on the second power electrode and the peripheral rim portion is arranged on the third conductive pad on the first major surface of the insulating board. In embodiments including two peripheral rim portions, the second peripheral rim portion is arranged on a fourth conductive pad of the first major surface of the insulating board. The third and fourth insulating conductive pads are arranged on opposing sides of the semiconductor device. In some embodiments, the contact clip has the form of a can including a recess for the semiconductor device that is surrounded by side walls. The base of the recess is formed by the web portion and the side walls by the peripheral rim portions of the contact clip.

In block 73, the first power electrode, the control electrode and the peripheral rim portion are electrically connected to the first, second and third conductive pads on the first major surface of the redistribution substrate and the web portion is of the contact clip is electrically coupled to the second power electrode in order to fabricate a semiconductor package having the package footprint.

The methods of fabricating a semiconductor package described with reference to FIGS. 3a-3b and 4 are described in relation to a single semiconductor package. However, a number of semiconductor packages are typically fabricated using the same process. For example, typically a panel is provided that includes a large number of package positions arranged in a grid of rows acid columns, immediately adjacent package positions being separated by dicing regions or lines. Each package position provides a redistribution substrate 24 for a package 20. After assembling the semiconductor device 23 and contact clip 25 in each of the positions, the panel may be subjected to a solder reflow treatment and then the individual packages separated from the panel by dicing or singulating the redistribution substrate 24 along the dicing regions.

FIG. 5 illustrates a semiconductor package 80 including the semiconductor device 23 including the first power electrode 26 and control electrode 27 on a first side 28 and the second power electrode 29 on the second side 30, the redistribution substrate 24 including the insulating board 31 with conductive pads 40 arranged on the first major surface 32 and solderable contact pads 22 arranged on second major surface 33 which form the footprint. 21 and the contact clip 25 having peripheral rim portions 35, 35' extending from opposing sides of the web portion 34.

The semiconductor package 80 differs from the semiconductor package illustrated in FIGS. 1a to 3b in the structure of the vertical conductive paths 41 which are used to electrically connect the first power electrode 26 and control electrode 27 to the solderable contact pads 22 on the second major surface 33 of the insulating redistribution substrate 24 and in the arrangement of she contact pads 46, 47 for the first power electrode 26 and she control electrode 27 on the first major surface 32 and in the arrangement of the solderable contact pads 43, 44 for the first power electrode 26 and the control electrode on the first major surface 33.

In this embodiment, a conductive via 81 is provided in which an aperture 82 is provided in the insulating hoard. 31 for the first power electrode 26 that has a larger area than the conduct vias 54 illustrated in FIGS. 1a to 3b. For example, the aperture 82 may have an area that is at least half of the area of the first power electrode 26. The aperture 82 in the insulating board 31 is lined with conductive material, for example one or more metal or alloy layers 83. The metal layer 83 is connected to the solderable contact pad 43 on the second major surface 33 and may be connected to the conductive pad 46 on the first major surface 32.

The contact pad 46 is arranged on the first major surface 32 adjacent the side faces 84 of the aperture 82 and the solderable contact pad 43 is arranged on the second major surface 33 adjacent the side faces of the aperture 82. The central portion of she aperture 82 is uncovered by the contact pads 46, 43 and provides an open ended through hole in the insulating board 31. The contact pad 46 is electrically coupled to the conductive layer 83 arranged on the sidewall 34 of the aperture 82 and to the solderable contact pad 43 arranged on the second major surface 33. At least a portion of the first power electrode 26 is positioned above the aperture 82 and remains uncovered by the contact pads 46 and 43.

In this embodiment, the conductive pads 46, 47 and the solderable contact pads 43, 44 for the first power electrode 26 and the control electrode 27, respectively, may be considered to the split contact pads, since they have portions arranged on opposing sides of the apertures 82, 90, respectively. The solderable contact pads 43, 44 and the conductive pads 46, 47 may have each the form of a ring.

The electrical connection between the first power electrode 26 and the solderable contact pad 43 arranged on the second major surface 33 of the insulating core layer 31 is provided by solder 85. The solder 85 is positioned in the aperture 82 and is in direct contact with the first power electrode 26 arranged on the first major surface 32, the conductive layer 83 on the sidewalls 84 of the aperture 82 and the solderable contact pad 43 positioned on the second major surface. The solder 85 fills the aperture 82 and the opening in the solderable contact pad 43.

The semiconductor device 23 is attached to the upper surface first major surface 32 of the insulating board. 31 by an insulating adhesive 86 which may cover the conductive pad 46 positioned on the first major surface 32 of the dielectric board 31. The insulating adhesive 86 may be positioned on the peripheral regions of the control electrode 21 and in the region between the first power electrode 26 and control electrode 21. The peripheral regions of the first surface 28 of the semiconductor device 23 may also include a portion of the insulating material 87. In some embodiments, in contrast with the embodiments illustrated in FIGS.

1*a* to 3*b*, the first power electrode 26 is not in electrical contact with the conductive pad 46 arranged on the first major surface 32.

In some embodiments, the conductive path from the control electrode 27 to a solderable contact pad 44 arranged on the second major surface 33 of the insulating layer 31 also a similar structure. The redistribution board 24 includes an aperture 90 which is positioned in the insulating board 31 such that the control electrode 27 is positioned above the aperture 90. The aperture 90 includes sidewalls 91 which are lined with conductive material 92 that is connected to portions of the solderable contact pad 44 arranged on second major surface 33 immediately adjacent the aperture 90. The conductive material 92 may also be electrically connected to portions of the conductive pad 17 arranged on the first major surface 32 of the insulating board 31 adjacent the aperture 90. The control electrode 27 is electrically connected to the solderable contact pad. 44 by solder 93 which is positioned in the aperture 90 such that is in direct contact with the control electrode 27, the conductive material 92 positioned on the sidewalls 91 and on the solderable contact pad 44 arranged on the second major surface 33. The solder 93 may fill the aperture 90. The control electrode 27 may be electrically insulated from the conductive pad. 47 by the electrically insulating adhesive 86 be electrically coupled to the redistribution structure 39 by the solder 93 and solderable contact pad 44.

The semiconductor device 80 may have the same footprint 21 as that provided by the continuous contact solderable contact pads 22 of the embodiments illustrated in FIGS. 1*a* to 3*b*. The split solderable contact pads 43, 44 determine the lateral extent of the solder 85, 93. The apertures 82, 90 in the split solderable contact pads 43, 44 are covered and filed by the solder 85, 93. Consequently, if the outer contours of the contact pads 43, 44 correspond to the outer contours of the contact pads 43, 44 of the redistribution board 24 of FIGS. 1*a* to 3*b*, the footprint. 21 provided by the contact pads 43, 44 and solder 85, 93 of the package 80 is the same as that illustrated in FIGS. 1*a* to 3*b*.

In the embodiment illustrated in FIG. 5, the conductive vertical conductive path 41 used to electrically couple the peripheral rim portions 35, 35' of the contact clip 25 to the solderable contact pads 42, 42' arranged on the second major surface 33 of the insulating board 31 is provided by a conductive via 54 which is filled with one or more metals or alloys as in the embodiments illustrated in FIGS. 1*a* to 3*b*.

FIG. 6 illustrates a semiconductor package 100 including a semiconductor device 23, redistribution substrate 24 and contact clip 25 which is similar to the embodiment illustrated in FIG. 5.

The semiconductor package 100 differs from the semiconductor package 80 of FIG. 5 in the vertical conductive path 41 used to electrically couple the peripheral rim portions 35, 35' of the contact clip 25 to the solderable contact pads 42, 42' on the second major surface 33 of the insulating board 31. In the embodiment illustrated in FIG. 6, at least two conductive vias 54 extend between each of the conductive pads 48, 49 on the upper surface 32 of the insulating board 31 and the associated solderable contact pad 42, 42' arranged on the second major surface 33 of the insulating board 31. Each of the conductive vias 54 is filled one or more metals or alloys.

As in the embodiment illustrated in FIG. 5, the semiconductor device 23 is attached to the first major surface 32 of the insulating board 31 by electrically insulating adhesive 86. The first power electrode 26 is electrically coupled to the solderable contact pad 43 by solder 85 which extends through the aperture 81 in the insulating board 31 and the control electrode 27 is electrically coupled to the solderable contact pad 44 on the second major surface 33 of the insulating board 31 by solder 93 positioned in the aperture 91 as in the embodiment illustrated in FIG. 5.

FIG. 7 illustrates a semiconductor package 110 which includes a semiconductor device 23, redistribution substrate 24 and contact clip 25 and is similar to the embodiment illustrated in FIGS. 5 and 6.

The semiconductor package 110 differs from the semiconductor packages 80, 100 of FIGS. 5 and 6 in the structure of the conductive path 11 used to electrically couple the peripheral rim portions 35, 35' to the solderable contact pads 42, 42 on the second major surface 33 of the insulating board 31. The vertical conductive paths 41 are provided by solder filled apertures having a similar form to that used for the first power electrode 26 and the control electrode 27.

The insulating board 31 includes an aperture 111 which is positioned in and extends through the thickness of the insulating board. 31 such that a portion of the lower surface 38 of the peripheral rim portion 35 is positioned above the aperture 111. The aperture 111 includes sidewalls 112 which aligned with one or more metal or alloy layers 113 which are in direct contact with the conductive pad 48 which is positioned directly adjacent the aperture 111 on the first major surface 32 of the insulating board 31. Similarly, the solderable contact pad 42 has a split structure with portions arranged adjacent the sidewalls 112 of the aperture ill on the second major surface 33 of the insulating board 31. The solderable contact pad 42 is in direct contact with the conductive lining 113 on the sidewalls 112. Solder material 114 is positioned within and fills the aperture ill such that it extends through the entire thickness of the insulating board 31 and is in contact with the lower surface 38 of the peripheral rim portion 35 and with the solderable contact pad. 42 thus electrically coupling the contact clip 25 and the second power electrode 29 to the solderable contact pad 42.

In embodiments in which the contact clip 25 includes one or more further peripheral rim portions, the redistribution substrate 24 can include the structure for she peripheral rim portion 35 illustrated in FIG. 1 for each peripheral portion.

The use of the same type of vertical conductive path 11 for each of the internal connections, i.e. the internal connections between the contact clip 25, the first power electrode 26 and the control electrode 27 and the first major surface 32 of the insulating board 31, may be used to simplify manufacturing and lower manufacturing costs. For example, all of the vertical contact conductive paths 41 may be provided by an aperture and the conductive connection with the opposing surface of the redistribution board may be made by use the same material, for example solder.

In some embodiments, the metal layer lining the sidewalls of the apertures may be omitted. In embodiments, in which the first power electrode 26 and the control electrode 21 are not electrically connected to the conductive pad 46, 47 on the first major surface, the conductive pads 46, 41 may be omitted. Other materials, such as silver sintered material may be used in place of the solder.

As mentioned above in relation to the methods described with reference to FIGS. 3*a*-3*b* and 4, the method of fabricating the semiconductor package according to any one of the embodiments described in connection with FIGS. 5 to 7 may also be carried out for a number of semiconductor packages by providing a panel with a plurality of package positions, typically arranged in rows and columns, with each package position providing a redistribution substrate 24 for a single semiconductor package. After assembly of the semiconductor device 23 and contact clip 25 on the first major surface 32 of the insulating board 31, introduction of the solder into the apertures 82, 90, 111, and solder reflow, the redistribution substrate 24 may be diced or singulated to separate the individual semiconductor packages from the assembly or panel.

FIG. 8a illustrates a cross-sectional view of a panel 120 including a plurality of package positions 121 arranged in a grid of rows and columns. Each package position. 121 includes a semiconductor package including a semiconductor device 23, a redistribution substrate 24 and a contact clip 25. In the embodiment illustrated in FIG. 8a, the redistribution substrate 24 has the structure illustrated in FIG. 7. However, in other non-illustrated embodiments, the redistribution structure 24 may have other forms, for example the forms illustrated in FIGS. 1a-1c, 2, 3a-3b and 5 to 7.

A plurality of contact clips 25 is provided in the form of a leadframe 122 in which each contact clip 25 is connected to an adjacent contact clip 25 by tie bars 123. In the illustrated embodiments has the form of a can 124 with a recess 125 for the semiconductor device having a base 126 and side walls 127. FIG. 8b illustrates a top view of the leadframe 122 including the plurality of cans 124. The leadframe 122 enables a plurality of contact clips or cans so be applied to a plurality of package positions 121 on the panel 120 at substantially the same time.

The assembly illustrated in FIG. 8a may be fabricated by attaching the semiconductor device 23 to the first major surface 32 of the insulating board 31 using electrically insulating adhesive. The first power electrode 26 is positioned above and covers the aperture 82 and the control electrode 27 is positioned above and covers the aperture 90. Solder 128 may then be applied to the first major surface 32 of the redistribution substrate 24 on the conductive pads 48, 49 for the peripheral rim portions 35, 35' of the contact clip 25 and onto the outwardly facing second power electrode 29 of the semiconductor device 23. The leadframe 122 including the plurality of contact clips 25 may be positioned on the first major surface, such that the mounting surface 36 of each of the clips 25 is positioned on the solder 128 positioned on the second power electrode 29 and the peripheral rim portions 35, 35' are positioned on the solder 128 positioned on the conductive pads 48, 49.

A solder reflow process may then be carried out by heating the assembly to a temperature above the melting point of the solder 128 to attach the contact clip 25 to the second power electrode 29 and to the redistribution substrate 24 and to attach the first power electrode 26 and control electrode 27 to the redistribution substrate 24. Solder 129 may then be applied to the second major surface 33 of the redistribution substrate 24 such that it fills the apertures 82, 90, 111 and is positioned on the solderable contact pads 22 and a second reflow process can be carried out. The package may be diced by cutting along the tie bars 123 of the leadframe 122 and through the thickness of the panel 120 at the dicing positions 130 between the package positions 121 to separate the individual semiconductor packages from the panel 120.

The leadframe 122 including the plurality of contact clips 25 may be formed by half etching in order to form the recesses 125 for accommodating the semiconductor device 23 and to form the tie bars 124.

FIGS. 9a and 9b illustrate an alternative method of fabricating a semiconductor package. The semiconductor device 23 is attached to the first major surface 32 of the redistribution substrate 24 by adhesive that may be electrically insulating. Solder 128 is applied to the leadframe 122 and, in particular, to the base 126 of the can 124 and surfaces 38 of the peripheral rim portions 35, 35'. The redistribution substrate 24 including the attached semiconductor devices 23 is inverted and placed on the leadframe 122 such that the second power electrode 29 is positioned within the cart 124 and the peripheral rim portions 35, 35' are positioned onto the contact pads 48, 49. Solder 129 is then applied to the second major surface 33 of the redistribution substrate 24 such that the apertures 82, 90, 111, if present, are filled with the solder 129 and the solder 129 is positioned on the solderable contact pads 22 on the second major surface 33 of the redistribution substrate 24.

In this method, a single solder reflow process can be carried out so as to mechanically and electrically attach the second power electrode 29 to the contact clip 25 and to the peripheral rim portions 35, 35' of the contact clip 25 that are in turn electrically connected to the conductive pads 48, 49 and solderable contact pads 42, 42' of the redistribution substrate 24 and the first power electrode 26 and control electrode 27 of the semiconductor device 23 the solderable contact pads 43, 44 of the redistribution substrate 24.

The individual packages can then be separated from the panel 120 by dicing along the non-device regions 130. In this embodiment, the dicing may be carried out from the second major surface 33 of the redistribution substrate 24.

Figure 10:
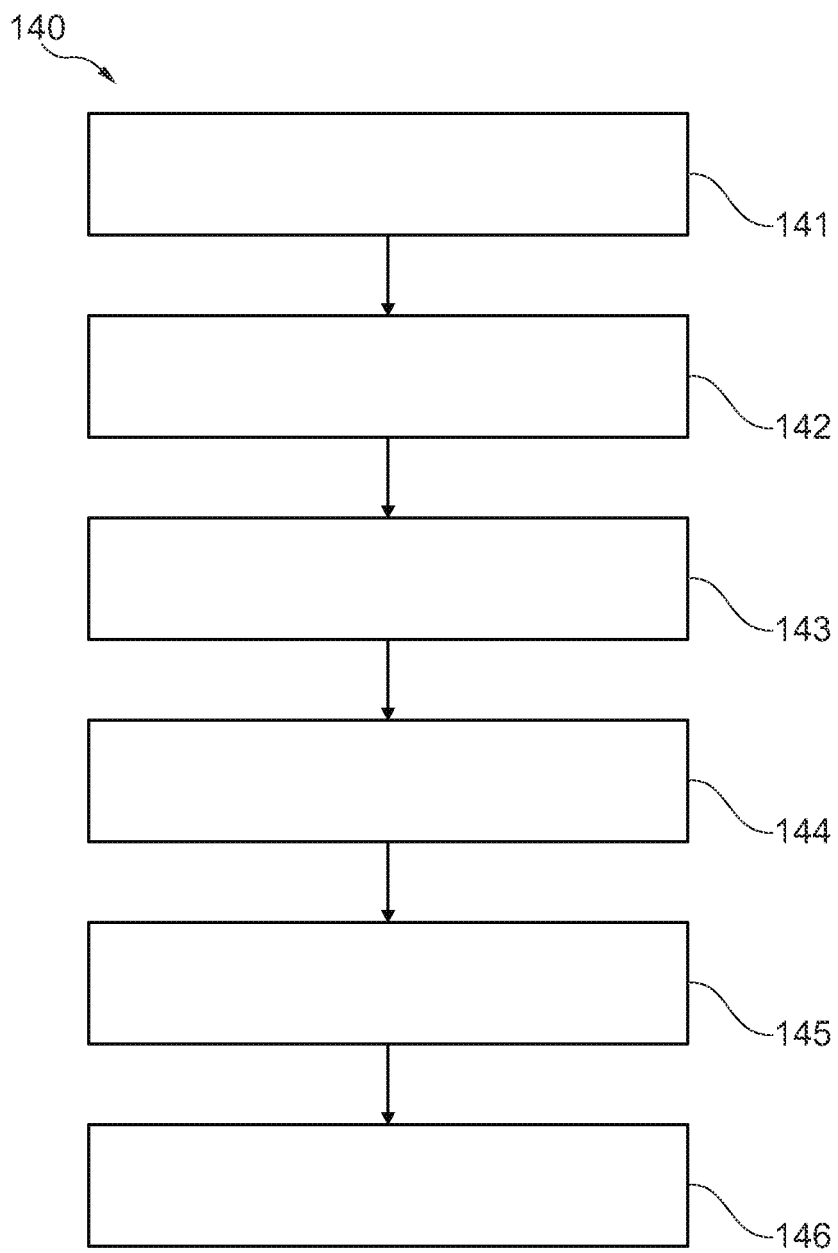
FIG. 10 illustrates a flowchart of a method of fabricating a semiconductor package.

FIG. 10 illustrates a flow chart 140 of a method for fabricating a semiconductor package.

In block 141, a semiconductor device is arranged on a redistribution substrate. The semiconductor device has a first power electrode and a control electrode on a first surface and a second power electrode on a second surface that opposes the first surface. The redistribution substrate comprises an insulating board having a first major surface and the second major surface having solderable contact pads that form a package footprint. The redistribution substrate comprises one or more apertures extending from the first major surface to the second major surface. The semiconductor device is arranged on the redistribution substrate so that the first power electrode is arranged on a first conductive pad and the control electrode is arranged on a second conductive pad on the first major surface of the insulating board. The aperture is positioned adjacent or in one of the solderable contact pads and adjacent or in one of the first and second conductive pads.

In block 142, a contact clip comprising a web portion and one or more peripheral rim portions is arranged on the semiconductor device such that the web portion is arranged on the second power electrode and the peripheral rim portion is arranged on the third conductive pad on the first major surface of the insulating board. In embodiments including two peripheral rim portions, the second peripheral rim portion is arranged on a fourth conductive pad of the first major surface of the insulating board. The third and fourth insulating conductive pads are arranged on opposing sides of the semiconductor device. In some embodiments, the contact clip has the form of a can including a recess for the semiconductor device that is surrounded by side walls. The base of the recess if formed by the web portion and the side walls by the peripheral rim portions of the contact clip.

In block 143, the first power electrode or the control electrode or the peripheral rim portion of the contact clip is arranged on the first major surface so that the first power electrode or the control electrode or the peripheral rim portion forms a base of the aperture. In some embodiments, an aperture is provided in the insulating board for each or the first power electrode, the control electrode and the peripheral rim portion of the contact clip, the apertures being arranged to be vertically aligned with one of the first power electrode, the control electrode and the peripheral rim portion of the contact clip.

In block 144, solder is inserted into the aperture such that it is positioned on the first power electrode or the control electrode or the peripheral rim portion, on at least side faces of the aperture and on a solderable contact pad on the second major surface of the redistribution substrate.

In block. 145, the solder is melted to electrically couple the first power electrode or the control electrode or the peripheral rim portion to the solderable contact pad.

In block 146, the first power electrode, the control electrode and the peripheral rim portion are electrically connected to the first, second and third conductive pads on the first major surface of the redistribution substrate and the web portion is of the contact clip is electrically coupled to the second power electrode in order to fabricate a semiconductor package having the package footprint.

In some embodiments, the first power electrode and the control electrode are mounted on the first major surface of the insulating board by insulating adhesive. In some embodiments, the first power electrode and/or the control electrode is not electrically connected to the conductive pads on the first major surface of the insulating board. In some embodiments, no conductive pads for one or both of the first power electrode and control electrode are provided. In these embodiments, the first power electrode and/or the control electrode may be attached to the insulating board by adhesive, for example an electrically insulating adhesive.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor package, the method comprising:
arranging a semiconductor device on a redistribution substrate, the semiconductor device having a first power electrode and a control electrode on a first surface and a second power electrode on a second surface opposite the first surface, the redistribution substrate comprising an insulating board having a first major surface and a second major surface having solderable contact pads that form a package footprint, so that the first power electrode is arranged on a first conductive pad and the control electrode is arranged on a second conductive pad on the first major surface of the insulating board;
arranging a contact clip comprising a web portion and one or more peripheral rim portions on the semiconductor device such that the web portion is arranged on the second power electrode and the peripheral rim portion is arranged on a third conductive pad on the first major surface of the insulating board;
electrically coupling the first power electrode, the control electrode and the peripheral rim portion to the respective conductive pads on the first major surface of the redistribution substrate and electrically coupling the web portion to the second power electrode; and
mounting the first power electrode and the control electrode on the first major surface of the insulating board by an insulating adhesive.

2. The method of claim 1, further comprising:
applying solder to the first conductive pad, the second conductive pad, and the third conductive pad;
arranging the first power electrode on the solder positioned on the first conductive pad and the control electrode on the solder positioned on the second conductive pad;
applying solder to the second power electrode;
applying the web portion of the contact clip to the solder positioned on the second power electrode and the peripheral rim of the contact clip on the solder positioned on the third conductive pad and forming an assembly; and
heating to above the melting point of the solder and electrically coupling the first power electrode, the control electrode, and the peripheral rim portion to the respective conductive pads on the first major surface of the redistribution substrate and electrically coupling the web portion of the contact clip to the second power electrode.

3. The method of claim 1, wherein the first, second and third conductive pads are each electrically coupled by a conductive via to first, second and third solderable contact pads, respectively, on the second major surface of the insulating board such that heating electrically couples the first power electrode to the first solderable contact pad, the control electrode to the second solderable contact pad, and the second power electrode to the third solderable contact pad.

4. The method of claim 1, wherein the redistribution substrate comprises an aperture extending from the first major surface to the second major surface, the method further comprising:
arranging the first power electrode or the control electrode or the peripheral rim portion of the contact clip on the first major surface so that the first power electrode or the control electrode or the peripheral rim portion forms a base of the aperture;
inserting solder into the aperture such that the solder is positioned on the first power electrode or the control electrode or the peripheral rim portion, on at least side faces of the aperture and on a solderable contact pad on the second major surface of the redistribution substrate; and
melting the solder to electrically couple the first power electrode or the control electrode or the peripheral rim portion to the solderable contact pad.

5. The method of claim 1, wherein the redistribution substrate further comprises at least one conductive via extending from the first major surface to the second major surface, the method further comprising:
electrically coupling, by the at least one conductive via, a conductive pad on the first major surface with at least one of the plurality of solderable outer contact pads on the second major surface.

6. The method of claim 1, further comprising electrically coupling a further semiconductor device with the semiconductor device by the contact clip to form a circuit.

7. The method of claim 6, wherein the further semiconductor device comprises a freewheeling diode or a transistor coupled in a half bridge configuration with the semiconductor device.

8. The method of claim 1, wherein the redistribution substrate comprises a first aperture and a second aperture both extending from the first major surface to the second major surface, the method further comprising:
arranging the first power electrode and the control electrode on the first major surface so that the first power electrode forms a base of the first aperture and the control electrode forms a base of the second aperture;
inserting first solder into the first aperture such that the first solder is positioned on the first power electrode, on at least side faces of the first aperture and on a first solderable contact pad on the second major surface of the redistribution substrate;
inserting second solder into the second aperture such that the second solder is positioned on the control electrode, on at least side faces of the second aperture and on a second solderable contact pad on the second major surface of the redistribution substrate; and
melting the first solder to electrically couple the first power electrode to the first solderable contact pad and melting the second solder to electrically couple the control electrode to the second solderable contact pad.

9. The method of claim 8, wherein the first solderable contact pad has a split structure with portions arranged adjacent the side faces of the first aperture on the second major surface of the insulating board.

10. The method of claim 8, wherein the second solderable contact pad has a split structure with portions arranged adjacent the side faces of the second aperture on the second major surface of the insulating board.

11. The method of claim 1, wherein at least two conductive vias extend between the third conductive pad on the upper surface of the insulating board and a solderable contact pad arranged on the second major surface of the insulating board.

12. The method of claim 11, wherein each of the at least two conductive vias is filled by one or more metals or alloys.

13. The method of claim 1, wherein the redistribution substrate comprises an aperture extending from the first major surface to the second major surface, the method further comprising:
arranging the peripheral rim portion of the contact clip on the first major surface so that the peripheral rim portion forms a base of the aperture;
inserting solder into the aperture such that the solder is positioned on the peripheral rim portion, on at least side faces of the aperture and on a solderable contact pad on the second major surface of the redistribution substrate; and
melting the solder to electrically couple the peripheral rim portion to the solderable contact pad.

14. The method of claim 13, wherein the solderable contact pad has a split structure with portions arranged adjacent the side faces of the aperture on the second major surface of the insulating board.

15. The method of claim 13, wherein the solderable contact pad is in direct contact with a conductive lining on the side faces of the aperture.

16. The method of claim 13, wherein the solder is positioned within and fills the aperture such that the solder extends through an entire thickness of the insulating board and is in contact with a lower surface of the peripheral rim portion and with the solderable contact pad.

17. A method of fabricating a semiconductor package, the method comprising:
arranging a semiconductor device on a redistribution substrate, the semiconductor device having a first power electrode and a control electrode on a first surface and a second power electrode on a second surface opposite the first surface, the redistribution substrate comprising an insulating board having a first major surface and a second major surface having solderable contact pads that form a package footprint, so that the first power electrode is arranged on a first conductive pad and the control electrode is arranged on a second conductive pad on the first major surface of the insulating board;
arranging a contact clip comprising a web portion and one or more peripheral rim portions on the semiconductor device such that the web portion is arranged on the second power electrode and the peripheral rim portion is arranged on a third conductive pad on the first major surface of the insulating board;
electrically coupling the first power electrode, the control electrode and the peripheral rim portion to the respective conductive pads on the first major surface of the redistribution substrate and electrically coupling the web portion to the second power electrode,
wherein the redistribution substrate comprises an aperture extending from the first major surface to the second major surface;
arranging the first power electrode or the control electrode or the peripheral rim portion of the contact clip on the first major surface so that the first power electrode or the control electrode or the peripheral rim portion forms a base of the aperture;
inserting solder into the aperture such that the solder is positioned on the first power electrode or the control electrode or the peripheral rim portion, on at least side faces of the aperture and on a solderable contact pad on the second major surface of the redistribution substrate; and
melting the solder to electrically couple the first power electrode or the control electrode or the peripheral rim portion to the solderable contact pad.

18. The method of claim 17, further comprising mounting the first power electrode and the control electrode on the first major surface of the insulating board by insulating adhesive.

19. A method of fabricating a semiconductor package, the method comprising:
arranging a semiconductor device on a redistribution substrate, the semiconductor device having a first power electrode and a control electrode on a first surface and a second power electrode on a second surface opposite the first surface, the redistribution substrate comprising an insulating board having a first major surface and a second major surface having solderable contact pads that form a package footprint, so that the first power electrode is arranged on a first conductive pad and the control electrode is arranged on a second conductive pad on the first major surface of the insulating board;

arranging a contact clip comprising a web portion and one or more peripheral rim portions on the semiconductor device such that the web portion is arranged on the second power electrode and the peripheral rim portion is arranged on a third conductive pad on the first major surface of the insulating board;

electrically coupling the first power electrode, the control electrode and the peripheral rim portion to the respective conductive pads on the first major surface of the redistribution substrate and electrically coupling the web portion to the second power electrode, wherein the redistribution substrate comprises a first aperture and a second aperture both extending from the first major surface to the second major surface;

arranging the first power electrode and the control electrode on the first major surface so that the first power electrode forms a base of the first aperture and the control electrode forms a base of the second aperture;

inserting first solder into the first aperture such that the first solder is positioned on the first power electrode, on at least side faces of the first aperture and on a first solderable contact pad on the second major surface of the redistribution substrate;

inserting second solder into the second aperture such that the second solder is positioned on the control electrode, on at least side faces of the second aperture and on a second solderable contact pad on the second major surface of the redistribution substrate; and melting the first solder to electrically couple the first power electrode to the first solderable contact pad and melting the second solder to electrically couple the control electrode to the second solderable contact pad.

20. The method of claim 19, further comprising mounting the first power electrode and the control electrode on the first major surface of the insulating board by insulating adhesive.

21. The method of claim 19, wherein the first solderable contact pad has a split structure with portions arranged adjacent the side faces of the first aperture on the second major surface of the insulating board.

22. The method of claim 19, wherein the second solderable contact pad has a split structure with portions arranged adjacent the side faces of the second aperture on the second major surface of the insulating board.

* * * * *

UNITED STATES PATENT AND TRADEMARK OFFICE
CERTIFICATE OF CORRECTION

| | | |
|---|---|---|
| PATENT NO. | : 11,776,882 B2 | Page 1 of 1 |
| APPLICATION NO. | : 17/712375 | |
| DATED | : October 3, 2023 | |
| INVENTOR(S) | : M. Dinkel et al. | |

It is certified that error appears in the above-identified patent and that said Letters Patent is hereby corrected as shown below:

On the Title Page

Item (56) U.S. Pat. Docs. (Line 1), please change "Kerman" to -- Yerman --.

Signed and Sealed this
Thirtieth Day of January, 2024

Katherine Kelly Vidal
*Director of the United States Patent and Trademark Office*